United States Patent [19]
Taniguchi

[11] Patent Number: 6,035,430
[45] Date of Patent: Mar. 7, 2000

[54] SEMICONDUCTOR INTEGRATED CIRCUIT DEVICE WITH RESTORING CIRCUIT

[75] Inventor: Kazutaka Taniguchi, Kanagawa, Japan

[73] Assignee: NEC Corporation, Tokyo, Japan

[21] Appl. No.: 08/954,098

[22] Filed: Oct. 20, 1997

[30] Foreign Application Priority Data

Oct. 21, 1996 [JP] Japan ................................ 8-277756

[51] Int. Cl.[7] .............................. G01R 31/28; H04L 1/18
[52] U.S. Cl. .......................................... 714/724; 714/733
[58] Field of Search .................................. 714/718–724, 714/733

[56] References Cited

U.S. PATENT DOCUMENTS 3,760,261  9/1973  Collins .................................. 324/72.5
3,997,818  12/1976  Bodkin .................................. 361/100
4,344,101  8/1982  Oishi et al. ............................ 361/75

FOREIGN PATENT DOCUMENTS 1-183832   7/1989   Japan.
4-123399   4/1992   Japan.
5-282892   10/1993  Japan.
8-23016    1/1996   Japan.

Primary Examiner—Emmanuel L. Moise
Attorney, Agent, or Firm—Sughrue, Mion, Zinn, Macpeak & Seas, PLLC

[57] ABSTRACT

A destroy restoring circuit comprises a fuse and a resistor which generate a signal for setting a destroyed state to stop a function of an output circuit; a fuse and a resistor which generate a signal for restoring to a normal operation state after the setting of the destroyed state; a NOR circuit which logically synthesizes the signals to generate a signal for an output circuit. With this construction, as the function when both of the fuses are cut becomes the same as when the fuses are not cut, the output circuit operates normally.

10 Claims, 5 Drawing Sheets

SEMICONDUCTOR INTEGRATED CIRCUIT DEVICE WITH RESTORING CIRCUIT

BACKGROUND OF THE INVENTION

1. Field of the Invention

The present invention relates to a semiconductor integrated circuit device, more particularly to a semiconductor integrated circuit device comprising a redundancy constitution.

2. Description of the Related Art

A semiconductor integrated circuit device having a redundancy circuit to relieve defective circuit portions in a memory and the like requires a primary checking for examining whether defects can be relieved by the use of a redundancy circuit, during a selection step performed for the integrated circuit on a wafer. The semiconductor integrated circuit device requires also a secondary checking for examining whether products, after having been relieved by the use of the redundancy circuit, are non-defectives, during that selection step. In the primary checking, a plurality of checkings are performed, in which judgments are made to sort the products into non-defectives, redundancy products which are used as non-defectives by use of a redundancy circuit, and defectives which have no possibility of being used as non-defectives in spite of the use of a redundancy circuit. After the primary checking, the redundancy products are relieved under the condition that a redundancy circuit is used for them. Thereafter, in the secondary checking, in order to examine whether the redundancy products are non-defectives, all of the same checking items as those in the primary checking are examined. However, since the secondary checking is conducted for the semiconductor integrated circuit device on the wafer, the same tests are conducted for the products regarded as defectives in the primary checking. The defectives in the primary checking are always regarded as the defectives, so that examining the foregoing products in the secondary checking prolongs the time per wafer for performing the secondary checking. In order to shorten the time for the secondary checking, the following two ways have been used.

First, in a first conventional testing method of a semiconductor integrated circuit device disclosed in Japanese Patent Application Laid Open No. 183832/1989, it is decided whether a redundancy circuit can be substituted for the defective circuit, and the semiconductor integrated circuit device subjected to the checking is destroyed if the substitution for the defective circuit by the redundancy circuit is impossible.

The first conventional testing method of a semiconductor integrated circuit device will be described with reference to the FIG. 1. flow chart. After a primary checking is executed (Step P1), if a chip can be relieved by use of a redundancy circuit, a relieving action is performed. A chip which is regarded as a defective in a primary checking, even though a redundancy circuit is used, is destroyed using a high voltage or laser light beam at the time as the action to relieve a redundancy product (Step P3). At the beginning of the secondary checking, the defectives of the primary checking can be discriminated by a contact check without executing all of the same checking items as those of the primary checking (Step P4). If the contact check is passed, an operation test is executed (Step P5). Thus, it will be possible to shorten the time of the secondary checking.

Next, in a second conventional method of testing a semiconductor integrated circuit device, disclosed in Japanese Patent Application Laid Open No. 282892/1993, non-defectives are programmed in a primary checking, whereby a circuit is set so that a chip is discriminated as a non-defective in an examination at an early stage of a secondary checking. Therefore, the chip decided as the non-defective is not subjected to the secondary checking and unnecessary examinations in the secondary checking can be omitted.

The second conventional method of testing a semiconductor integrated circuit device will be described with reference to the FIG. 2 flow chart. After a primary checking is executed (Step Q1), discrimination data relating to non-defectives and defectives in the primary checking are stored using a programming circuit installed in the device (Step Q2). At the time of the secondary checking if the contact check is passed (Step Q3), the discrimination data relating to the non-defective and the defective status are read out (Step Q4). If the product is regarded as a defective as a result of the primary checking, the product is treated as defective, and the examination of this product is not performed so that the checking time is shortened.

If the product is regarded as non-defective as a result of the primary checking, an operation test is executed (Step Q5).

Next, referring to FIG. 3 showing the programming circuit, the programming circuit 101 is connected with an input terminal T1 used for testing and an output terminal T2, via a NAND circuit A101. The result of a logic product of an output level of the programming circuit 101 and an input level of the input terminal T1 for testing is output from the NAND circuit A101 to the output terminal T2 for testing.

When a fuse F101 of the program circuit 101 is not cut, a signal P at the connection node of the fuse F101 and a resistor R101 is high in level. This high level of the signal P is inverted by an inverter I101 and an output signal Q from the inverter I101 is low in level. Therefore, since this one of the inputs to the NAND circuit A101 is always low in level, a voltage level of the output terminal T2 for testing is always high in level whether or not a level of a voltage applied to the input terminal T1 for testing is high in level or low in level. When the fuse F101 of the program circuit 101 is cut, the signal P is set to be low in level, this low level of the signal P is inverted by the inverter I101 so that the signal Q is set to be high in level. As a result, since one of the inputs to the NAND circuit A101 is always high in level, upon application of a high level to the input terminal T1 for testing, a low level is output to the output terminal T2 for testing. According to the foregoing procedures, a state of the program circuit can be detected.

Since, in the foregoing testing method of conventional first semiconductor integrated circuit device, the chip regarded as defective in the primary checking is destroyed at the time of the relieving action for the redundancy product, it is impossible to specify which portion is defective. Therefore, there has been a drawback that after the secondary checking an execution of analyzing for the products decided as the defectives by the primary checking is difficult.

Moreover, since in the foregoing method of testing conventional second semiconductor integrated circuit devices, it is necessary to perform examinations for all of the chips on the wafer in the secondary checking, the examinations being for checking the data of results of the primary checking and being originally unnecessary in the second checking, and the time for the secondary checking is more prolonged than in the conventional first semiconductor integrated circuit device. Particularly, the checking time is prolonged when the defectives in the primary checking are not present on the wafer. An example will be made using numerical values concretely. It is assumed that 500 chips are present on the wafer and 1 second is needed to examine data relating to the result of checking the quality of the products on one chip. When the defectives of the primary checking are not present in 500 chips, the checking time per one wafer is prolonged by 500 seconds.

SUMMARY OF THE INVENTION

The object of the present invention is to provide a semiconductor integrated circuit device capable of shortening a time for a secondary checking performed for the chips on a wafer.

Another object of the present invention is to provide a semiconductor integrated circuit device capable of restoring a destroyed chip to an initial state, so that an analysis for a chip which has been decided as a defective in a primary checking can be easily executed after a secondary checking.

According to a preferred embodiment of this invention, a semiconductor integrated circuit device performs primary checking during a selection step for determining whether the device is a perfectly good product, a redundancy product that will become a good product by a relieving procedure, or a defective product that cannot become a good product even by the relieving procedure, and secondary checking is performed for determining whether the redundancy product after the relieving procedure is non-defective, the semiconductor integrated circuit device comprising: an output circuit (or an input circuit), and a destroy restoring circuit for setting the output circuit (or the input circuit), for a product determined as a completely defective product in the primary checking, to a first function (a destroyed state), and for setting the output circuit (or the input circuit) for a second function to restore the output circuit (or the input circuit) from the destroyed state to a normal operation state.

In addition, the destroy restoring circuit preferably comprises first and second state setting means, each composed of a fuse and a resistor which are connected in series to each other between first and second power sources, for outputting first and second state signals, respectively, corresponding to non-cutting/cutting of the fuse, and a logic circuit for logically synthesizing the first and second state signals and generating a function setting signal indicative of the first function, or second function to be output to the output circuit.

The above and other objects, features and advantages of the present invention will become apparent from the following description based on the accompanying drawings which illustrate examples of preferred embodiments of the present invention.

DETAILED DESCRIPTION OF THE PREFERRED EMBODIMENTS

Figure 4:
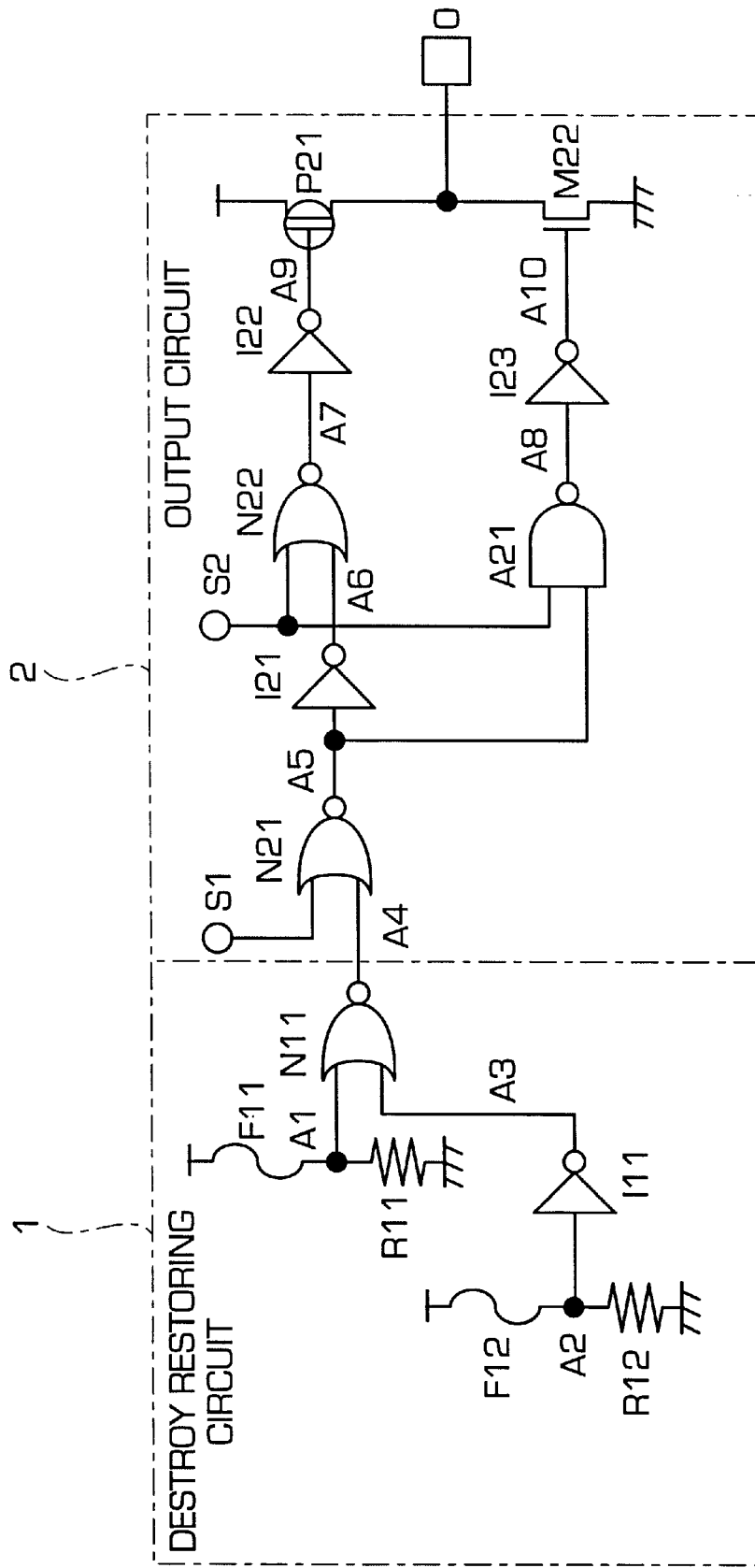
FIG. 4 is a circuit diagram showing a first embodiment of a semiconductor integrated circuit device of the present invention.

Next, referring to FIG. 4, showing an embodiment of the present invention with a circuit diagram, the semiconductor integrated circuit device of this embodiment comprises a destroy restoring circuit 1 which sets defectives to be checked to an output circuit 2 of a semiconductor integrated circuit device and restores them to original states.

The destroy restoring circuit 1 comprises fuses F11 and F12, one of the terminals of each being connected to a power source and the other terminal of each generating an output corresponding to one of signals A1 and A2 respectively; resistors R11 and R12, one of the terminals of each being connected to the corresponding one of fuses F11 and F12, respectively, and the other terminal of each being connected to a ground potential; an inverter I11 which inverts the signal A2 supplied to its input terminal and outputs a signal A3 from its output terminal; and a NOR circuit N11 which receives the signal A1 in one input terminal thereof and the signal A3 in the other input terminal thereof and outputs a state signal A4. The output circuit 2 comprises a NOR circuit N21 which performs a NOT OR operation, for the state signal A4 and a control signal S1 controlling the output circuit 2 from the outside, and outputs an internal control signal A5; an inverter I21 which inverts the signal A5 to output a signal A6; a NOR circuit N22 which performs a NOT OR operation, for a data signal S2 from a memory cell and a signal A6, to output a signal A7; a NAND circuit A21 which performs a NOT AND operation, for the data signal S2 and a signal A5, to output a signal A8; inverters I22 and I23 which invert the signals A7 and A8 to output signals A9 and A10, respectively; and P and N-type MOS transistors P21 and M22 which output an output signal O in response to the supply of signals A9 and A10.

Next, an operation of this embodiment of the present invention will be described with reference to FIG. 4. First, since in the destroy restoring circuit 1 the fuses F11 and F12 are in a non-cut state as an initial condition and they are in a conductive state, each of the signals A1 and A2 is high in level. Moreover, the inverter I11 inverts the input signal A2 so that the output signal A3 from the inverter I11 is low in level. Therefore, the input signals A1 and A3 to the two input terminals of the NOR circuit N11 are high and low in level, respectively, so that the NOR circuit N11 outputs the output signal A4 at low level.

Since the one input terminal of the NOR circuit N21 of the output circuit 2 receives the input signal A4 at low level, the level of the output signal A5 from the NOR circuit N21 is decided depending on the level of the control signal S1. Specifically, when the control signal S1 is low in level, the signal A5 is high in level, and the output from the NAND circuit A21 is decided depending on the data signal S2. On the other hand, since the input signal A6 to the NOR circuit N22 is low in level because of inverting the high level of the signal A5 to the low level, the output signal A7 from the NOR circuit N22 is decided depending on the level state of the data signal S2.

When the data signal S2 is high in level, the signals A7 and A8 are low in level, and the signals A9 and A10 are high in level. The P-type MOS transistor P21 is turned off and N-type MOS transistor M22 is turned on so that they output the output signal O at a low level.

On the contrary, when the data signal S2 is low in level, the signals A7 and A8 are high in level and the signals A9 and A10 are low in level. Therefore, the P-type MOS transistor P21 is turned on and the N-type MOS transistor M22 is turned off, so that they output the output signal O at a high level.

As described above, in the state where both of the fuses F11 and F12 are at the non-cutting state, the output circuit 2 operates normally.

Next, when the fuse F11 is cut, the signal A1 becomes low in level from the ground potential through the resistor R11. At this time, since the fuse F12 is in a non-cutting state, the signal A3 remains low in level, the output signal A4 of the NOR circuit N11 becomes high in level. For this reason, the output signal A5 of the NOR circuit N21 always remains low in level regardless of the state of the control signal S1. Moreover, since the signal A6 which is an inverted signal of the signal A5 is always high in level, the output signal A7 of the NOR circuit N22 becomes low in level regardless of the data signal S2. Upon receipt of the signal A7, the output signal A9 of the inverter I22 becomes high in level, thereby turning off the P-type MOS transistor P21. Moreover, the output signal A8 of the NAND circuit A21 is high in level regardless of the state of the data signal S2 and the signal A10 which is an inverted signal of the signal A8 is low in level, whereby the N-type MOS transistor M22 is turned off. Thus, nothing is output as the output signal O. Therefore, cutting of the fuse F11 produces a malfunctioned operating state of the output circuit 2.

Next, in a state where the fuse F11 is cut whereby a malfunction operation is set, when the fuse F12 is also cut, the signal A2 becomes low in level from the ground potential through the resistor R12. For this reason, the output signal A3 of the inverter I11 becomes high in level. Since the signal A3 is high in level, the output signal A4 of the NOR circuit N11 is always low in level regardless of a level of the signal A1. Since this state is the same as that where both of the fuses F11 and F12 are not cut, the output circuit 2 operates normally. Specifically, the chip is destroyed by cutting the fuse F11 and subsequently the fuse F12 is cut, whereby the destroy restoring circuit 1 can restore the defective state to the initial state.

Figure 5:
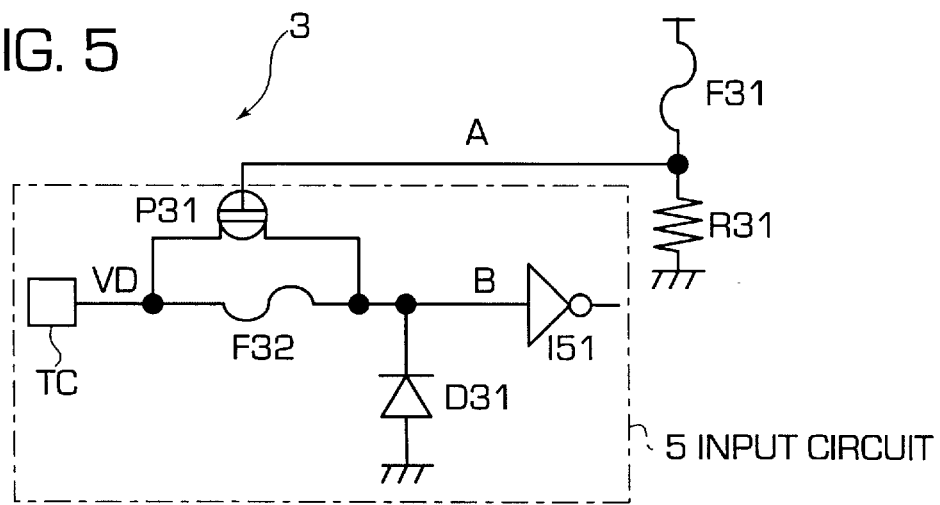
FIG. 5 is a circuit diagram showing a second embodiment of a semiconductor integrated circuit device of the present invention.

Next, referring to FIG. 5 showing a second embodiment of the present invention with a circuit diagram, the second embodiment of the present invention is different from the first embodiment in that instead of the destroy restoring circuit 1, a destroy restoring circuit 3 is provided which destroys an input circuit 5 of defectives in a primary checking and is capable of performing the same operation as that before destroying at the time of analyzing troubles.

Destroy restoring circuit 3 which constitutes a part of the input circuit 5 comprises a fuse F31, one terminal of which is connected to the power source and the other terminal of which generates an output signal A; a resistor R31, one terminal of which is connected to the other terminal of the fuse F31 and the other terminal of which is connected to the ground potential; a P-type MOS transistor P31, a source of which is connected to an input terminal TC and a gate of which is connected to the other terminal of the fuse F31; a fuse F32 which is connected between the source and the drain of the transistor P31 and outputs, at one terminal a signal B to a inverter I51; and a diode D31, one terminal of which is connected to the other terminal of the fuse F32 and the other terminal of which is connected to the ground potential.

An operation of the second embodiment of the present invention will be described. First, in a state where the fuses F31 and F32 are not cut, since the signal A from the fuse F31 connected to the power source is high in level, the transistor P31 is in a turned-off state. When a voltage VD, equal to a voltage in a forward direction of the diode D31 or more is applied to the input terminal TC, since the input terminal TC and the diode D31 are connected via the fuse F32, a current flows from the ground potential to the input terminal TC via the diode D31. By detecting this current, a checking apparatus (not shown) judges that the input terminal TC is connected thereto.

Next, when the fuse F32 is cut and the fuse F31 is in a connected state, the transistor P31 remains in the turned-off state, and the connection of the input terminal TC and the diode D31 is cut-off by cutting the fuse F32, whereby no current flows even though the voltage VD is applied to the input terminal TC. Therefore, the detection apparatus decides that the input terminal TC is not connected thereto. The product is treated as defective.

When the fuse F31 is also cut in a state where the fuse F32 is at a cutting state, the ground potential is applied to the signal A via the resistor R so that the signal A becomes low in level. The transistor P31 comes to be in a turned-on state. Thus, the input terminal TC and the diode D31 come to be in a connected state. When the voltage VD is applied to the input terminal TC, a current flows from the ground potential to the input terminal TC via the diode D31. Thus, the detection apparatus judges that the input terminal TC is connected thereto. Specifically, the chip is destroyed by cutting the fuse F32, and the defective is restored to the initial state by cutting the fuse F31.

Figure 6:
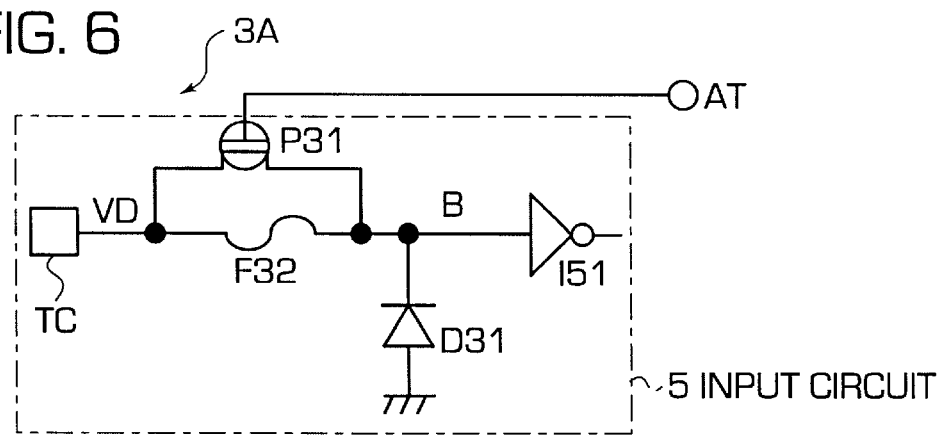
FIG. 6 is a circuit diagram showing a third embodiment of a semiconductor integrated circuit device of the present invention.

Next, referring to FIG. 6 showing a third embodiment of the present invention with a circuit diagram in which constitutional components common to those in FIG. 5 are denoted by common characters and numerals, a destroy restoring circuit 3A of the third embodiment is different from that of the second embodiment in that instead of the signal A generated by the fuse F31 and the resistor R31, a test mode decision signal AT is used.

An operation of the third embodiment of the present invention will be described. The test mode decision signal AT is normally high in level and is low in level at a test mode. First, when the test mode decision signal AT is made low in level and a test mode is begun at a state where the fuse F32 is cut, the input terminal TC and the diode D31 are connected. When a voltage VD is applied to the input terminal TC, a current flows into the input terminal TC similar to the case of the second embodiment, and a detection apparatus decides that the input terminal is connected thereto. Specifically, the chip is destroyed by cutting the fuse F32, and a low level is applied as the signal AT at the test mode, whereby the defective is restored to the initial state.

Figure 7:
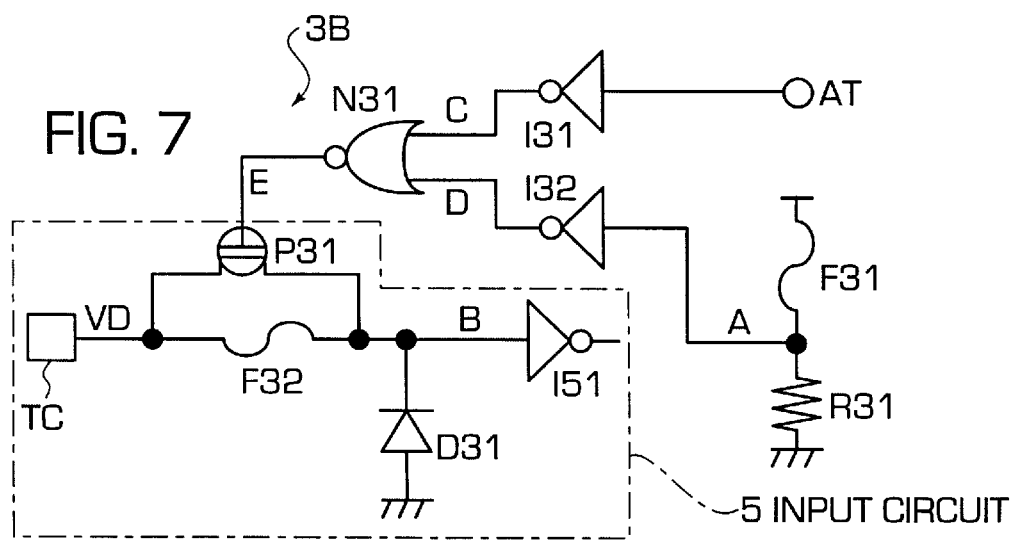
FIG. 7 is a circuit diagram showing a fourth embodiment of a semiconductor integrated circuit device of the present invention.

Next, referring to FIG. 7 showing a fourth embodiment of the present invention with a circuit diagram in which constitutional components common to those in FIG. 5 are denoted using common characters and numerals, a destroy restoring circuit 3B of the fourth embodiment is different from that of the second and third embodiments in that a gate voltage of the P-type MOS transistor P31 is controlled by a signal E obtained by NOR circuit N31 performing an NOT OR operation for inverted signals C and D, the inverted signal C being obtained by inverting the test mode decision signal AT by the inverter I31 and the inverted signal D being obtained by inverting the fuse output A by an inverter I32.

Next, an operation of the fourth embodiment will be described. First, in a state where the fuse F32 is at non-cutting state, that is, at connection state, when a voltage VD is applied to the input terminal TC, a current flows into the input terminal TC similarly to the case of the second and third embodiments, regardless of the state of the fuse F31 and the test mode decision signal AT, and the checking apparatus decides that the input terminal TC is connected thereto.

Specifically, the signal A is high in level when the fuse F31 is at a non-cutting state, and the inverted signal D obtained by inverting the signal A is low in level. Moreover, when the test mode decision signal AT is high in level, the inverted signal C obtained by inverting the signal AT is low in level. Since both inputs to the NOR circuit N31 are low in level, an output E of the NOR circuit N31 becomes high in level, whereby the transistor P31 is normally turned off. At this time, when the fuse F32 is at cutting state, the input terminal TC and the diode D31 are not connected, and the chip is in a destroyed state.

Next, when the fuse F31 is cut or the test mode decision signal AT is low in level in a state where the fuse F32 is in a cut-state, the input signal of either C or D of the NOR circuit N31 becomes high in level, and the output signal of the NOR circuit N31 becomes low in level. Thus, the transistor P31 is turned on, and the input terminal TC and the diode D31 enter the connected state. Specifically, by cutting the fuse F32, the chip is destroyed, and either by cutting the fuse F31 or by making the test mode decision signal AT low in level, the chip can be restored to an initial state.

Figure 1:
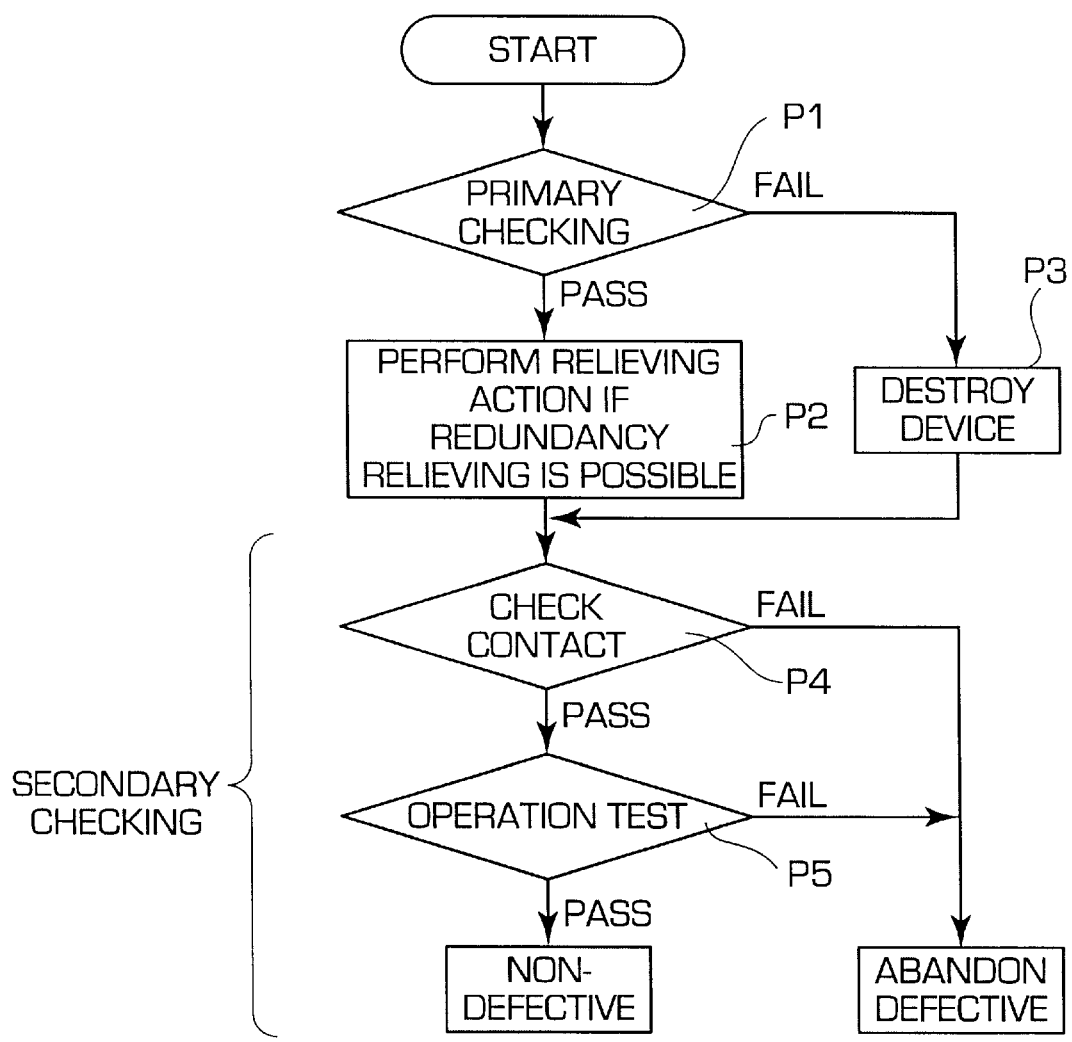
FIG. 1 is a flow chart showing an example of a checking method for a conventional first semiconductor integrated circuit device.
Figure 2:
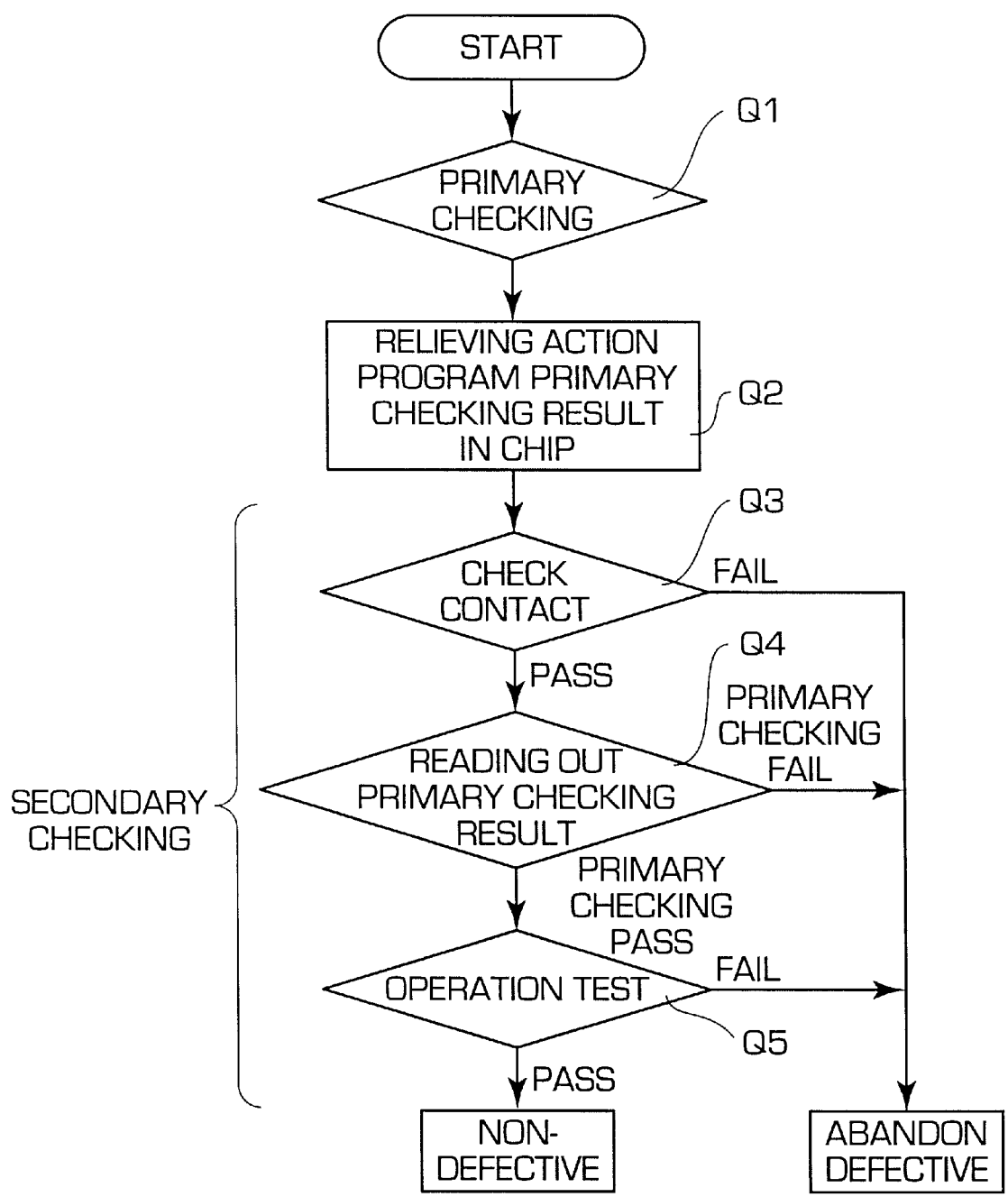
FIG. 2 is a flow chart showing an example of a checking method for a conventional second semiconductor integrated circuit device.
Figure 3:
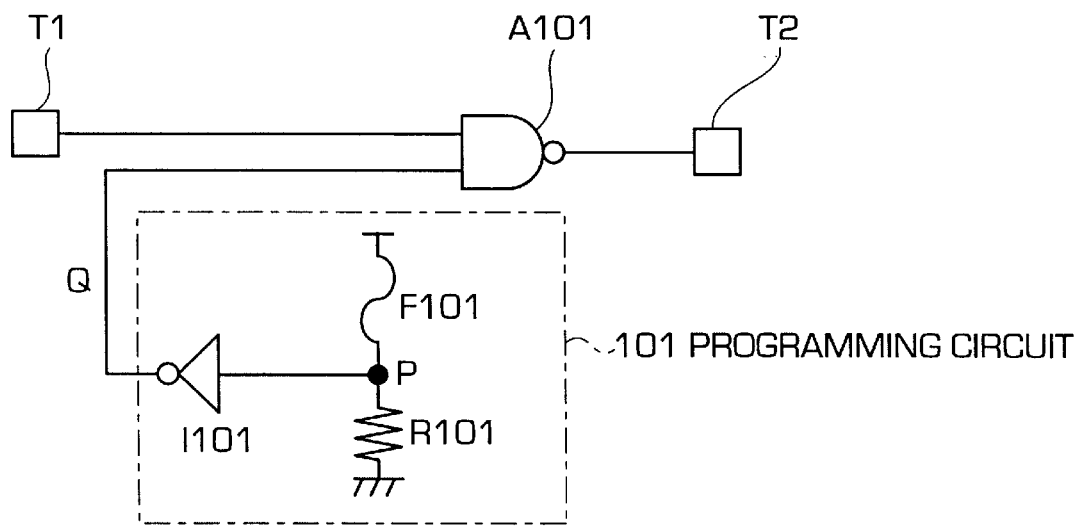
FIG. 3 is a circuit diagram showing a configuration of the conventional second semiconductor integrated circuit device.
Figure 8:
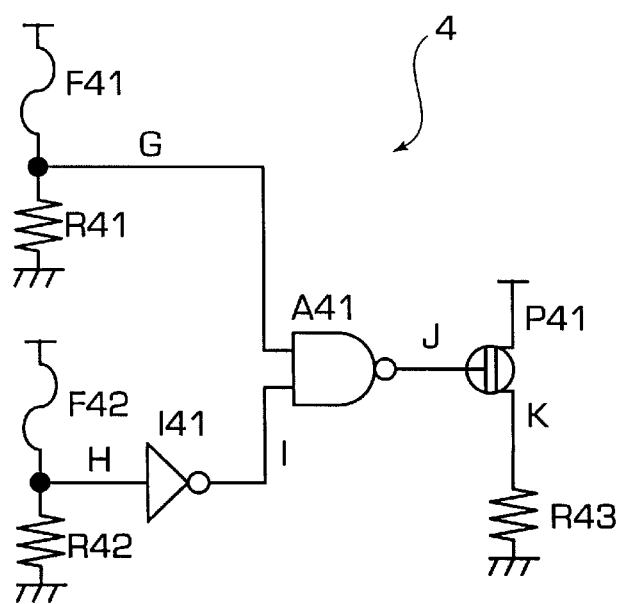
FIG. 8 is a circuit diagram showing a fifth embodiment of a semiconductor integrated circuit device of the present invention.

Next, referring to FIG. 8 showing a destroy restoring circuit 4 characterizing a fifth embodiment of the present invention, the destroy restoring circuit 4 of this embodiment comprises: fuses F41 and F42, one terminal of each being connected to the power source and the other terminal of each generating output signals G and H, respectively; resistors R41 and R42, one terminal of each being connected to the corresponding terminal of F41 and F42 and the other terminals of which are connected to the ground potential; an inverter I41 which generates a signal I obtained by inverting a signal H input to the input terminal thereof; a NAND circuit A41 which generates a signal J by performing a NOT AND operation for the signals G and I; a PMOS transistor P41, a source of which is connected to the power source, a drain of which is connected to one terminal of a resistor R43, and a gate of which receives the signal J, the other terminal of the resistor R43 being connected to the ground potential.

Next, an operation of this embodiment of the present invention will be described. First, when the fuses F41 and F42 are in a non-cut state, the signals G and H become high in level, and the inverted signal I obtained by inverting the signal H becomes low in level. Since the two inputs of the NAND circuit A41 are high and low in level, respectively, the signal J of the NAND circuit N41 becomes high in level. Therefore, since the transistor P41 is turned off, a current K does not flow from the power source. In a case where the fuse F42 is cut, the signal H is made low in level by the resistor R42 connected to the ground potential, and the inverted signal I of the signal H becomes high in level. At this time, if the fuse F41 is not cut-off, the two inputs of the NAND circuit A41 become high in level. The transistor P41 is turned on, and the current K flows into the ground from the power source whereby a current malfunction state is produced.

Next, when the fuse F41 is cut in a state where the fuse F42 is in a cut state, the signal G is made low in level through the resistor R41. Therefore, the input to the NAND circuit A41 are low and high in level, so that the NAND circuit A41 outputs the signal J at high level, whereby the transistor P41 is turned off. Thus, a current K from the power source through the transistor P41 is cut off, so that the current malfunction set by cutting the fuse F42 can be restored.

Specifically, it will be possible to destroy the chip by cutting the fuse F42, and it will later be possible to restore the chip to the initial state.

By mounting the destroy restoring circuit of the chip described above, checking is executed by a checking method which destroys the chip in which a secondary checking time amount is short. At the time of analyzing the defective, the destroyed chip is restored so that the analysis of the defective can be easily performed.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor integrated circuit device having a destroy restoring circuit for testing a predetermined circuit having a previously determined condition, wherein said destroy restoring circuit comprises:
   first function setting means for setting said predetermined circuit to a first state previously determined; and
   second function setting means for setting said predetermined circuit to a second state, to restore said predetermined circuit to an initial operation state.

2. A semiconductor integrated circuit device according to claim 1, wherein said first and second function setting means each comprise a fuse.

3. A semiconductor integrated circuit device that undergoes a primary checking during a selection step for determining whether said device is a perfectly good product, a redundancy product that becomes a good product by a relieving procedure, or a defective product that cannot become a good product even by said relieving procedure, and that undergoes a secondary checking for determining whether said redundancy product created by said relieving procedure is non-defective, said semiconductor integrated circuit device comprising:
   an output circuit; and
   a destroy restoring circuit for setting said output circuit, when said device is determined to be a completely defective product in said primary checking, to a first state that functions as a destroyed state, and for setting said output circuit, after said primary checking, to a second state that restores said output circuit from said destroyed state to a normal operation state.

4. A semiconductor integrated circuit device according to claim 3, wherein said destroy restoring circuit comprises:
   first and second state setting means, each comprising a fuse and a resistor which are connected in series between first and second power source potentials, for outputting first and second state signals, respectively, each of the first and second state signals corresponding to one of an intact state and an open state of the respective fuse; and
   a logic circuit for logically synthesizing said first and second state signals, generating a function setting signal indicative of said first function or second function, and outputting said function setting signal to said output circuit.

5. A semiconductor integrated circuit device according to claim 4, wherein said output circuit comprises:

output circuit setting means for setting said output circuit for a destroyed state in which an output signal of said output circuit is fixed regardless of other input signals to said output circuit, in response to said function setting signal indicative of said first function; and output circuit restoring means for restoring said output circuit from said destroyed state in which said output signal is fixed, to a normal operation state in which said output signal can be varied by said other input signals, in response to said function setting signal indicative of said second function.

6. A semiconductor integrated circuit device that undergoes a primary checking during a selection step for determining whether said device is a perfectly good product, a redundancy product that will become a good product by a relieving procedure, or a defective product that cannot become a good product even by said relieving procedure, and that undergoes a secondary checking for determining whether said redundancy product created by said relieving procedure is non-defective, said semiconductor integrated circuit device comprising:

an input circuit; and a destroy restoring circuit for setting said input circuit, when said device is determined to be a completely defective product in said primary checking, to a first state that functions as a destroyed state, and for setting said input circuit, during said secondary checking, to a second state that restores said input circuit from said destroyed state to a normal operation state.

7. A semiconductor integrated circuit device according to claim 6, wherein said destroy restoring circuit comprises:

first and second state setting means, each comprising a fuse and a resistor which are connected in series between first and second power source potentials, for outputting first and second state signals, respectively, each of the first and second state signals corresponding to one of an intact state and an open state of the respective fuse; and a logic circuit for logically synthesizing said first and second state signals, generating a function setting signal indicative of said first function or second function, and outputting said function setting signal to said input circuit.

8. A semiconductor integrated circuit device according to claim 6, wherein said destroy restoring circuit comprises:

first state setting means comprising a first fuse and a diode connected in series between an input terminal and a first power source potential, for outputting a first state signal corresponding to one of an intact state and an open state of said first fuse; and second state setting means comprising a second fuse and a resistor connected in series between said first power source potential and a second power source potential, for outputting a second state signal corresponding to an intact/open state of said second fuse; and a switching circuit which turns on in response to said second state signal, said switching circuit connected in parallel with said first fuse;

and wherein said input circuit is in a destroyed state when no current flows through said diode into said input terminal, in response to said first state signal output by said first state setting means, and wherein said input circuit is restored to a normal operation state, in which said switching circuit is turned on and said current flows, in response to said second state signal.

9. A semiconductor integrated circuit device according to claim 6, wherein said destroy restoring circuit comprises:

first state setting means comprising a first fuse and a diode connected in series between an input terminal and a first power source potential, for outputting a first state signal corresponding to one of an intact state and an open state of said first fuse; and a switching circuit which turns on in response to a second state signal set by a control signal, said switching circuit connected in parallel with said first fuse;

and wherein said input circuit is in a destroyed state when no current flows through said diode into said input terminal, in response to said first state signal output by said first state setting means, and wherein said input circuit is restored to a normal operation state, in which said switching circuit is turned on and said current flows, in response to said second state signal.

10. A semiconductor integrated circuit device according to claim 6, wherein said destroy restoring circuit comprises:

first state setting means comprising a first fuse and a diode connected in series between an input terminal and a first power source potential, for outputting a first state signal corresponding to one of an intact state and an open state of said first fuse;

second state setting means comprising a second fuse and a resistor connected in series between first and second power source potentials, for outputting a second state signal corresponding to an intact/open state of said second fuse;

a logic circuit which logically synthesizes said second state signal and a third state signal set by a control signal, and generates a fourth state signal;

and a switching circuit which turns on in response to said fourth state signal set by a control signal, said switching circuit connected in parallel with said first fuse, which turns on in response to said fourth state signal, and wherein said input circuit is in a destroyed state when no current flows through said diode into said input terminal, in response to said first state signal output by said first state setting means, and wherein said input circuit is restored to a normal operation state, in which said switching circuit is turned on and said current flows, in response to said fourth state signal.

* * * * *